(12) United States Patent
Miyamoto

(10) Patent No.: US 6,292,342 B1
(45) Date of Patent: Sep. 18, 2001

(54) VOLTAGE PROTECTION CIRCUIT FOR SEMICONDUCTOR TEST SYSTEM

(75) Inventor: Yasuhiro Miyamoto, Meiwa-machi (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/315,798

(22) Filed: May 21, 1999

(30) Foreign Application Priority Data

May 21, 1998 (JP) .................................. 10-139318

(51) Int. Cl.[7] .................................................. H02H 3/18
(52) U.S. Cl. .................. 361/86; 361/91.1; 361/91.2; 361/91.5; 324/763
(58) Field of Search .................. 361/86, 91.1, 91.2, 361/91.5; 324/750, 763

(56) References Cited

U.S. PATENT DOCUMENTS

| | | | |
|---|---|---|---|
| 4,636,721 | * 1/1987 | Howell et al. | 324/133 |
| 5,101,153 | * 3/1992 | Morong, III | 324/537 |
| 5,164,663 | * 11/1992 | Alcorn | 714/734 |

* cited by examiner

Primary Examiner—Michael J. Sherry
(74) Attorney, Agent, or Firm—Muramatsu & Associates

(57) ABSTRACT

A voltage protection circuit for a semiconductor test system has reduced number of components and functions as an excessive voltage clamp circuit and an abnormal voltage detection circuit. The voltage protection circuit includes a switch for selecting a reference voltage out of a predetermined clamp voltage and a predetermined abnormal threshold voltage, a clamp diode connected to an output of a device under test (DUT) to open or close the output of the DUT, a buffer amplifier for providing the selected reference voltage to the clamp diode, a resister series connected between an output of the buffer amplifier and the clamp diode for detecting an abnormal voltage in the output of the DUT, and a comparator for comparing the reference voltage and an output voltage of the DUT through the diode and generating a detection signal when the output of the DUT exceeds the reference voltage.

10 Claims, 3 Drawing Sheets

FIG.3 (Prior Art)
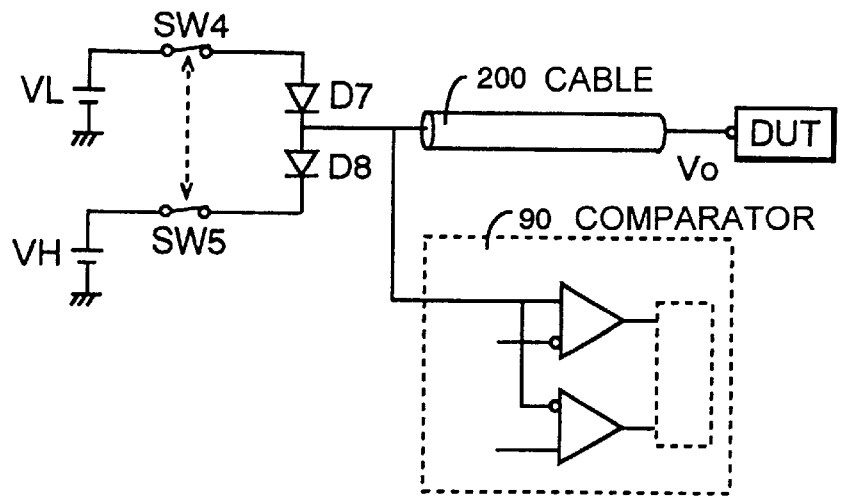
FIG.4 (a) (Prior Art)
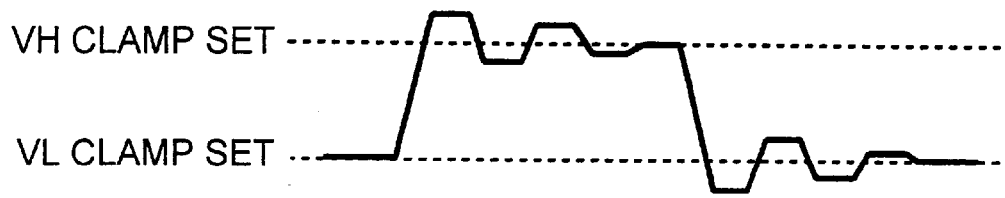
FIG.4 (b) (Prior Art)
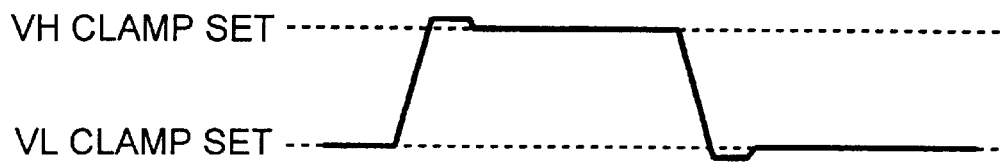
FIG.5 (Prior Art)
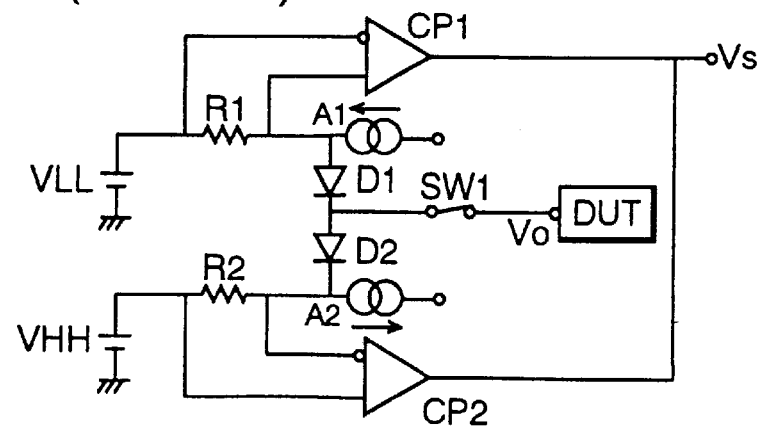

US 6,292,342 B1

VOLTAGE PROTECTION CIRCUIT FOR SEMICONDUCTOR TEST SYSTEM

FIELD OF THE INVENTION

This invention relates to a voltage protection circuit for a semiconductor test system, and more particularly, to a voltage protection circuit for a semiconductor test system which functions both as an excessive voltage clamp detection circuit and an abnormal voltage detection circuit with small number of components and low cost.

BACKGROUND OF THE INVENTION

In testing a semiconductor integrated circuit device by a semiconductor test system, the semiconductor IC device to be tested (device under test or DUT) is provided with test signals and the resultant output signals of the device under test are compared with expected value signals prepared in advance to determine whether the intended functions of the device under test is performed correctly.

Such a test signal is supplied to each pin of the device under test from a driver circuit via a transmission cable. The driver circuit functions as a buffer amplifier whereby providing a predetermined amplitude to the test signal. The resultant output signal of the device under test is compared with the expected value by a comparator. A large number of sets of driver circuits and comparators are assembled in a pin electronics unit in the semiconductor test system. To protect both the driver circuit and comparator as well as the device under test from excessive voltages caused by various factors, a voltage protection circuit is usually provided in connection with the driver circuit and comparator.

An example of conventional circuit diagram of a voltage protection circuit in a semiconductor test system is shown in FIG. 2. This example shows that the protection circuit is employed at the connection point between the comparator and the transmission cable (output of DUT). In this example, the protection circuit functions as both an excessive voltage clamp circuit and an abnormal voltage detection circuit. The operation of the circuit arrangement of FIG. 2 is explained with reference to FIGS. 2–5.

In the conventional example of FIG. 2, the main portion of the excessive voltage clamp circuit and the abnormal voltage detection circuit includes diodes D1–D8, buffer amplifiers OP1–OP4, comparators CP1 and CP2, and switches SW1, SW4 and SW5. A comparator 90 is provided to compare the output signal of the DUT which is resulted from a test signal provided to the DUT through a driver (not shown). Similar protection circuit can be arranged at the output of the driver circuit.

The excessive voltage clamp circuit clamps an excessive voltage in the output voltage of the DUT. The abnormal voltage detection circuit detects an abnormal voltage which is larger than the excessive voltage and opens the switch SW1 to disconnect the comparator 90 from the DUT.

First, the operation of the excessive voltage clamp circuit is explained. The excessive voltage clamp circuit comprises the diodes D3, D4, D7 and D8, the buffer amplifiers OP1 and OP2, and switches SW1, SW4 and SW5.

The switch SW1 remains closed (ON) when the clamping operation is performed. Also, the switches SW4 and SW5 remain closed (ON) when clamping operation on the output voltage from the DUT is performed.

The operation of the clamp circuit is explained with reference to a simplified circuit diagram of FIG. 3. In FIG. 3, only fundamental components are shown while omitting the buffer amplifiers OP1 and OP2 and diodes D3 and D4 therefrom for simplicity of explanation. The switches SW4, SW5 are turned on when the clamping operation is carried out and are turned off when the clamping operation for the output voltage of the DUT is not performed.

Thus, in FIG. 3, the excess voltage clamp circuit is basically configured by the switches SW4 and SW5 and the diodes D7 and D8. The connection point of the diodes D7 and D8 is commonly connected to the input of the comparator 90 which receives the output signal of the DUT through the transmission cable 200. Clamp voltages VH and VL in FIG. 2 are set to define the high level clamp voltage and the low level clamp voltage, respectively.

FIG. 4(a) shows an example of a voltage waveform when the output of the DUT through the transmission cable 200 is not clamped. As noted above, generally, a device under test (DUT) has a plurality of terminal pins, and each terminal pin is connected to the pin electronics unit having a comparator and a driver circuit, etc., through a corresponding transmission cable 200.

The transmission line 200 is so structured to have a characteristic (transmission) impedance, which is for example, 50 ohms. The impedance of the transmission cable is designed to match with the impedance of the terminal pin of the DUT to achieve an accurate test result in a high frequency range. However, a semiconductor test system needs to test various types of DUTs, and thus, the output impedance at a terminal pin of a DUT does not necessarily match with the impedance of the transmission cable.

For example, when the output impedance of the DUT is smaller than the impedance of the load (input of the comparator 90), a reflection waveform is superimposed on the transmission signal as shown in FIG. 4(a). In such a case, the testing on the DUT cannot be properly performed because the output voltage of the DUT received by the comparator 90 may exceed the voltage limit of the comparator 90 or include incorrect representation of the actual DUT output signal, thereby causing a breakdown or resulting in a measurement error in the test result.

Therefore, a semiconductor test system includes a voltage protection circuit such as shown in FIG. 2 to limit the output voltage of the DUT by establishing an upper clamp voltage and a lower clamp voltage. For example, when a DUT is a TTL IC, an upper clamp voltage VH of 5V and a lower clamp voltage VL of 0V for low voltage VL will be established in the excess voltage clamp circuit.

In FIG. 3, assuming a forward bias voltage of each of the diodes D7 and D8 is Vf. As is well known in the art, such a forward bias voltage of a silicon diode is 0.7V. Thus, in the case where the clamp voltages VH and VL are 5V and 0V, for example, the diode D8 turns on when the output of the DUT becomes higher than 5V+Vf. Consequently, the voltage at the input of the comparator 90 is limited to the voltage level of 5V+Vf by flowing a current from the DUT to the clamp voltage VH through the diode D8. Conversely, the diode D7 turns on when the output of the DUT becomes lower than 0V−Vf, thereby limiting the input voltage of the comparator 90 to the voltage level of 0V−Vf while allowing the current flow from the clamp voltage VL to the DUT. As a result, the output voltage of the DUT is clamped to limit the excessive voltage as shown by the voltage waveform of FIG. 4(b).

In the basic operation involved in the configuration of FIG. 3, there arises a potential difference of Vf in the actually clamped voltage from the intended clamp voltage VH or VL because of the forward bias voltage of the diodes D7 and D8. In order to avoid the effect of the forward bias voltage Vf in the foregoing, the protection circuit of FIG. 2 is designed to compensate the voltage difference by canceling the bias voltage Vf of each of the diodes D7 and D8. Such a function is performed by using a set of a buffer amplifier OP1 and a diode D3 and a set of a buffer amplifier OP2 and a diode D4. Each of the buffer amplifiers OP1 and OP2 functions as a voltage follower.

A constant current source A3 provides a bias current to the diode D3 to produce a forward bias voltage Vf in the diode D3. Similarly, a constant current source A4 provides a bias current to the diode D4 to produce a forward bias voltage Vf in the diode D4. Under this arrangement, the voltage at the anode of the diode D7 becomes VL+Vf and the cathode of the diode D8 becomes VH−Vf. Hence, the actually clamped voltage in the output of the DUT is equal to the upper clamp voltage VH or the lower clamp voltage VL.

Although not shown in FIG. 2, the buffer amplifiers OP1 and OP2 are provided with current limit circuits to protect themselves. The clamp circuit will not perform the clamping operation if the current through the diode and the buffer amplifier exceeds the range specified by the current limit circuit. In a case where an actual output waveform of the DUT is desired to be observed, the switches SW4 and SW5 are turned off to remove the clamping operation from the output voltage of the DUT.

The operation of the abnormal voltage detection circuit is explained in the following. In the example of FIG. 2, the abnormal voltage detection circuit comprises diodes D1, D2, D5 and D6 and buffer amplifiers OP3 and OP4, switch SW1, resistors R1 and R2, and comparators CP1 and CP2.

When the output voltage of the DUT becomes an abnormal voltage, an abnormal detection signal Vs is output, which turns off the switch SW1. The operation of the abnormal voltage detection circuit is explained with reference to a simplified structure of FIG. 5. The circuit diagram of FIG. 5 shows only the main components of the detection circuit by omitting the buffers amplifiers OP3 and OP4, the diodes D5 and D6 from the abnormal voltage detection circuit in FIG. 2. Thus, the basic circuit diagram of FIG. 5 shows the comparators CP1 and CP2, the resistors R1 and R2, the current sources A1 and A2, the diodes D1 and D2, and the switch SW1.

In FIG. 5, the output voltage of the DUT is represented by Vo, and the voltage values are set for a higher abnormal threshold voltage VHH and for a lower abnormal threshold voltage VLL, respectively. For example, in order to protect the components in the semiconductor test system such as comparators and driver circuits, the higher abnormal threshold voltage VHH is set to 8V and the lower abnormal threshold voltage VLL is set to −3V.

As to the comparators CP1 and CP2, to establish a voltage difference between two inputs of each comparator, the resisters R1 and R2 are provided between the corresponding two input terminals. By supplying the constant current from the constant current sources A1 or A2 to the resisters R1 or R2, the voltage difference (reverse bias) is created between the two input terminals of each comparator. Such an intentional voltage difference (reverse bias) promotes stability of operation in the comparator. This is because if a voltage difference between the two input terminals is very small, such as zero volt, the comparator may respond to small noise, resulting in the instability of operation.

As noted above, the forward bias voltage of each of the diodes D1 and D2 is Vf. If the output voltage Vo of the DUT exceeds 8V+Vf, the diode D2 turns on and a current flows from the DUT to the threshold voltage VHH through the diode D2 and the resister R2. When the current flowing through the resister R2 and the resultant voltage drop across the resister R2 exceeds the reverse bias, the comparator CP2 is activated to produce an abnormal detection signal Vs. The switch SW1 is then turned off in response to the abnormal detection signal Vs.

Similarly, if the output voltage Vo of the DUT is lower than −3V−Vf, the diode D1 turns on and current flows from the threshold voltage VLL to the DUT through the resistor R1 and the diode D1. Thus, when the current flowing to the resister R1 exceeds the constant current, the polarity of the voltage across resister R1 is reversed, and the comparator CP1 is activated to produce an abnormal detection signal Vs. The switch SW1 is then turned off in response to the abnormal detection signal Vs to separate the DUT from the semiconductor test system.

As described in the foregoing, even when an abnormal voltage is generated in either the high voltage side or the low voltage side due to the abnormality of the DUT, for example, the semiconductor test system is protected by isolating the output of DUT from the semiconductor test system by means of the switch SW1 using the abnormal voltage detection circuit.

In the more detailed circuit diagram of FIG. 2, the abnormal voltage detection circuit further includes the buffer amplifiers OP3 and OP4, and the diodes D5 and D6. Each of the buffer amplifiers OP3 and OP4 function as a voltage follower.

A constant current source A5 provides a bias current to the diode D5 to produce a forward bias voltage Vf across the diode D5. Similarly, a constant current source A6 provides a bias current to the diode D6 to produce a forward bias voltage Vf in the diode D6. Under this arrangement, the voltage at the anode of the diode D1 becomes VLL+Vf and the cathode of the diode D2 becomes VHH−Vf. Under this arrangement, the diode forward bias voltage Vf is canceled so that the actually detected output voltage of the DUT becomes equal to the upper threshold voltage VHH or the lower threshold voltage VLL.

In the arrangement of FIG. 2, when the switches SW4 and SW5 are turned on, both the abnormal voltage detection circuit and the clamp circuit are in simultaneously operation. However, as explained in the foregoing, the current limiting circuits (not shown) are provided to the buffer amplifiers OP1 and OP2 in the excess voltage clamp circuit, and the clamp circuit will not operate when the voltage exceeds the limiting range. Thus, in such a situation, only the abnormal voltage detection circuit operates.

As explained in the foregoing, in the conventional voltage protection circuit, although the circuitry and operation are similar between the excessive voltage clamp circuit and abnormal voltage detection circuit, they are constructed independently. Thus, the number of circuit components is relatively large, resulting in high cost and a large circuit size. Therefore, there is a need to realize a more cost effective protection circuit with less cost and circuit size.

SUMMARY OF THE INVENTION

Therefore, it is an object of the present invention to provide a voltage protection circuit for a semiconductor test system which is capable of functioning both as an excess voltage clamp circuit and an abnormal voltage detection circuit with a reduced number of circuit components.

It is another object of the present invention to provide a voltage protection circuit for a semiconductor test system which is capable of functioning both as an excess voltage clamp circuit and an abnormal voltage detection circuit with a decreased circuit size and low cost.

In the voltage protection circuit of the present invention, circuit components are commonly used in different functions so that the overall circuit components are reduced from the conventional example.

The voltage protection circuit for a semiconductor test system includes a switch for selecting a reference voltage out of a predetermined clamp voltage and a predetermined abnormal threshold voltage, a clamp diode connected to an output of a device under test (DUT) to open or close the output of the DUT, a buffer amplifier for providing the selected reference voltage to the clamp diode, a resister series connected between an output of the buffer amplifier and the clamp diode for detecting an abnormal voltage in the output of the DUT, and a comparator for comparing the reference voltage and an output voltage of the DUT through the diode and generating a detection signal when the output of the DUT exceeds the reference voltage.

According to the present invention shown in FIG. 1, the number of circuit components and circuit size are substantially decreased by eliminating two buffer amplifiers and two diodes from the conventional example of FIG. 2.

BRIEF DESCRIPTION OF THE DRAWINGS

FIG. 3 is a circuit diagram showing a basic structure of the excessive voltage clamp circuit in the conventional technology in the protection circuit of FIG. 2.

FIG. 4(a) is a timing chart showing an output waveform of the DUT, and

FIG. 4(b) is a timing chart showing an clamped output waveform of the DUT when the clamp circuit of FIG. 3 is in operation.

FIG. 5 is a circuit diagram showing a basic structure of the abnormal voltage detection circuit in the conventional technology in the protection circuit of FIG. 2.

DETAILED DESCRIPTION OF THE PREFERRED EMBODIMENTS

Figure 1:
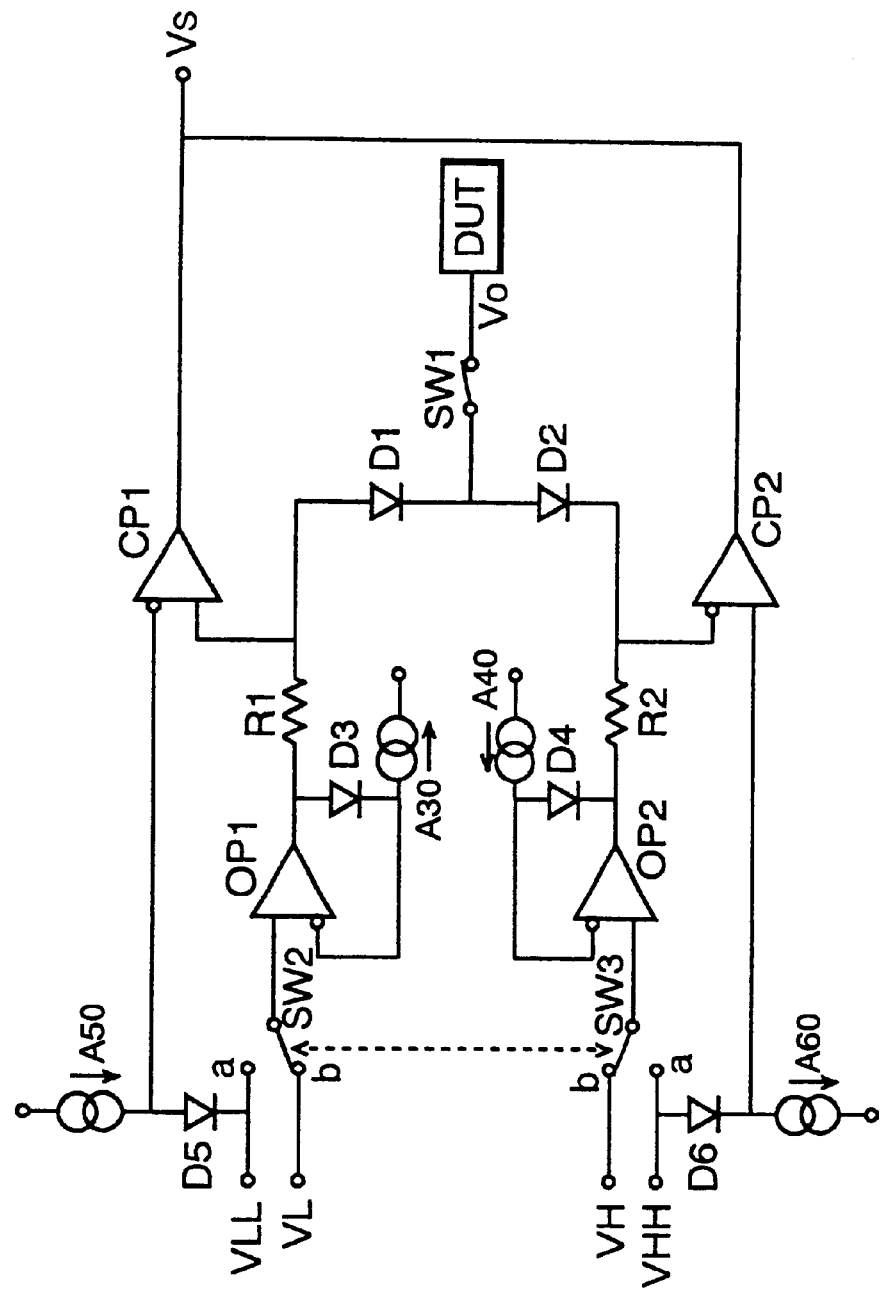
FIG. 1 is a circuit diagram showing an essential part of the voltage protection circuit of the present invention for a semiconductor test system which functions as an excessive voltage clamp circuit and an abnormal voltage detection circuit.

The configuration and operation of the embodiment of the present invention is explained with reference to FIG. 1. The voltage protection circuit of FIG. 1 is to be used in a semiconductor test system and functions both as an excessive clamp circuit and an abnormal voltage detection circuit. The voltage protection circuit includes diodes D1–D6, buffer amplifiers OP1 and OP2, comparators CP1 and CP2, switches SW1–SW3, resistors R1 and R2, and current sources A30, A40, A50 and A60.

The voltage protection circuit clamps the output voltage of a device under test (DUT) when the voltage exceeds the predetermined clamp voltage. The voltage protection circuit also detects and generates a detection signal when the output voltage of the DUT exceeds the predetermined threshold voltage so that the switch SW1 is turned off to isolate the DUT from the semiconductor test system.

First, the excessive voltage clamp circuit is explained in the following. The excessive voltage clamp circuit comprises the diodes D1, D2, D3 and D4, the buffer amplifiers OP1 and OP2, switches SW1, SW2 and SW3, the resistors R1 and R2, and the current sources A30 and A40. The switch SW1 is for separating the abnormal voltage from the test system, and remains closed during the clamping operation.

The resisters R1 and R2 are for abnormal voltage detection, and have small resistance of, for example, about 10 ohms. When the clamp circuit operates to detect an excessive voltage of the DUT output, the switches SW2 and SW3 are set to the side-b so as to receive the predetermined upper and lower clamp voltages VH and VL.

The buffer amplifiers OP1 and OP2 are voltage followers. The diode D3 is to compensate for a forward bias voltage Vf of the diode D1, and the diode D4 is to compensate for a forward bias voltage of the diode D2. The constant current source A30 provides a bias current, such as 500 $\mu$A, to the diode D3 to obtain the predetermined forward voltage bias Vf30. Similarly, the constant current source A40 provides a bias current, such as 500 $\mu$A, to the diode D4 to obtain the predetermined forward voltage bias Vf40.

Normally, the forward bias voltage Vf30 by the diode D3 and the forward bias voltage Vf by the diode D1 are equal to one another such as 0.7V in silicon diodes. Similarly, the forward bias voltage Vf40 by the diode D4 and the forward bias voltage Vf by the diode D2 are substantially identical. Therefore, when the upper clamp voltage VH and the lower clamp voltage VL are set, an output voltage of the buffer amplifier OP1 becomes VL+Vf and an output voltage of the buffer amplifier OP2 becomes VH−Vf, respectively. Thus, the actually clamped voltage in the output voltage of Vo of the DUT is almost equal to the predetermined upper clamp voltage VH or lower clamp voltage VL.

However, a small voltage difference between the predetermined clamp voltage VH or VL and an actual voltage may arise because of the voltage drop across R1 or R2 provided for detecting an abnormal voltage. In the case where compensation for this voltage difference is necessary, such a voltage difference can be canceled out by various means of the software or hardware in the test system.

In the foregoing explanation, when the DUT is a TTL IC, for example, the upper clamp voltage VH of 5V and the lower clamp voltage VL of 0V for low voltage VL may be set in the excess voltage clamp circuit in FIG. 1. The diode D2 turns on when the output voltage of the DUT becomes higher than 5V. Consequently, the voltage at the input of the comparator 90 (FIG. 2) is limited to the voltage level of 5V by flowing a current from the DUT to the clamp voltage VH through the diode D2. Similarly, the diode D1 turns on when the output of the DUT becomes lower than 0V, the output voltage of the DUT is limited to the voltage level of 0V while allowing the current flow from the clamp voltage VL to the DUT.

FIG. 4(a) shows the output voltage waveform of the DUT when the excessive voltage clamp circuit is not used. As described in the foregoing, the excess voltage clamp circuit performs in the manner shown in the waveform of FIG. 4(b) where the output voltage of the DUT is clamped by the predetermined clamp voltage VH or VL without being affected by the diode forward bias voltage.

The operation of the abnormal voltage detection circuit is explained in the following. The abnormal voltage detection circuit is configured by adding the diodes D5 and D6, the comparators CP1 and CP2, and the current sources A50 and A60 to the excess voltage clamp circuit described above.

The diodes D5 and D6 and the current sources A50 and A60 primarily serve as means for compensating the forward bias voltage of the diodes D1 and D2.

For detecting the abnormal voltage level in the output voltage Vo of the DUT, abnormal detection voltages VHH and VLL are set as a higher abnormal threshold voltage and a low abnormal threshold voltage, respectively. For example, the upper abnormal threshold voltage VHH is set to 8V and the lower abnormal threshold voltage VLL is set to −3V.

First, the operation of abnormal voltage detection circuit is explained when the switches SW2 and SW3 are in the side-b and thus the excessive voltage clamp circuit is in operation. Although not shown in FIG. 1, the clamp circuit has a current limiting circuit to protect buffer amplifiers OP1 and OP2. Thus, although the clamping operation is performed on the excessive voltage as long as the current flowing through the buffer amplifier is within the specified range. However, the clamping operation is not performed on the excessive voltage that causes the current through the buffer amplifier which exceeds the specified range.

When the excessive voltage causing the current to exceed the specified range noted above is applied, the impedance of the clamp circuit increases, because the current is limited in the buffer amplifier, and the clamping operation is no longer carried out. Thus, the voltage Vo+Vf at the non-inverting terminal of the comparator CP1 changes.

The constant current source A50 provides a predetermined bias current to diode D5, producing a forward bias voltage Vf50. Thus, the voltage at the inverting input terminal of the comparator CP1 is a sum of the lower abnormal threshold voltage VLL and the forward bias voltage Vf50 of the diode D5, i.e, VLL+Vf50. Consequently, when the voltage Vo+Vf at the non-inverting input terminal falls below the voltage VLL+Vf50 at the inverting input terminal, the comparator CP1 outputs an abnormal voltage detection signal Vs.

The constant current source A60 provides predetermined bias current to diode 6, producing a forward bias voltage Vf60. Thus, the voltage at the non-inverting terminal of the comparator CP2 is a difference between the higher abnormal threshold voltage VHH and the forward bias voltage Vf60 of the diode D6, i.e, VHH−Vf60. Consequently, when the voltage Vo+Vf at the inverting terminal exceeds the voltage VHH−Vf60 at the non-inverting terminal, the comparator CP2 outputs an abnormal voltage detection signal Vs.

Thus, for example, when the output voltage Vo of the DUT exceeds the upper threshold voltage such as 8V, the comparator CP2 outputs the abnormal voltage detection signal Vs. Similarly, when the output voltage Vo of the DUT exceeds the lower threshold voltage such as −3V, the comparator CP1 outputs the abnormal voltage detection signal Vs. Based on the detection signal Vs, the switch SW1 is opened to isolate the DUT from the test system.

Next, the operation of the abnormal voltage detection circuit is explained wherein the switches SW2 and SW3 are on the side-a and thus the excessive voltage clamp circuit is not in operation. The operation of the buffer amplifiers OP1 and OP2 is basically the same as that in the excessive voltage clamp circuit except the predetermined clamp voltages VH and VL are replaced with the predetermined threshold voltages VHH and VLL, respectively.

Suppose the output voltage Vo of the DUT is excessive so that the diode D1 turns on, the voltage Vo+Vf is provided to the non-inverting input terminal of the comparator CP1. The voltage at the inverting input terminal of the comparator CP1 is a sum of the lower abnormal threshold voltage VLL and the forward bias voltage Vf50 of the diode D5, i.e., VLL+Vf50.

Thus, when the voltage of the non-inverting input terminal Vo+Vf exceeds (falls below) the voltage of the inverting input terminal VLL+Vf50, the comparator CP1 outputs an abnormal voltage detection signal Vs.

In order to avoid instability arises when the voltage differential between the two input terminals of the comparator is very small, an intentional voltage difference is provided between the two input terminals produced by the bias voltage of the diode D5.

Normally, the output voltage of the buffer amplifier OP1 is applied to the non-inverting terminal of the comparator CP1 through the register R1. The output voltage of the buffer amplifier OP1 is a sum of the forward bias voltage Vf30 of the diode D3 produced by the bias current provided from the constant current source A30, for example, 500 $\mu$A, and the lower abnormal threshold voltage VLL, i.e, VLL+Vf30. As noted above, the voltage at the inverting input terminal of the comparator CP1 is VLL+Vf50.

The bias current from the constant source A50 is set, for example, to 250 $\mu$A so that the forward bias voltage Vf50 of the diode D5 is smaller than the forward bias voltage Vf30 of the diode D3 which receives the constant current of 500 $\mu$A as above. Since the voltage VLL+Vf30 is set higher than the voltage VLL+Vf50 as in the foregoing, the comparator CP1 operates in a stable manner.

If the voltage exceeding the voltage difference Vf30−Vf50 between the input terminals is applied, that is, the diode D1 is turned on and a current flows from the buffer amplifier OP1 to the DUT, and the resultant voltage drop at the non-inverting input terminal exceeds (falls below) the voltage of the inverting input terminal VLL+Vf5, the comparator CP1 outputs the abnormal voltage detection signal Vs to drive the switch SW1.

The high abnormal voltage detection operation is performed in the manner similar to the lower voltage detection in the foregoing. Suppose the output voltage Vo of the DUT is excessive so that the diode D2 turns on, the voltage Vo+Vf is provided to the inverting input terminal of the comparator CP2. The voltage at the non-inverting input terminal of the comparator CP2 is a difference between the upper abnormal threshold voltage VHH and the forward bias voltage Vf60 of the diode D5, i.e., VHH−Vf60.

Thus, when the voltage of the inverting input terminal Vo+Vf becomes higher than the voltage of the non-inverting input terminal VHH−Vf60, the comparator CP2 outputs an abnormal voltage detection signal Vs.

In order to avoid instability arises when the voltage differential between the two input terminals of the comparator is very small, an intentional voltage difference is provided between the two input terminals produced by the bias voltage of the diode D6.

Normally, the output voltage of the buffer amplifier OP2 is applied to the inverting terminal of the comparator CP2 through the register R2. The output voltage of the buffer amplifier OP2 is a difference between the forward bias voltage Vf40 of the diode D4 produced by the bias current provided from the constant current source A40, for example, 500 $\mu$A, and the higher abnormal threshold voltage VHH, i.e, VHH−Vf40. As noted above, the voltage at the non-inverting input terminal of the comparator CP2 is VHH−Vf60.

The bias current from the constant source A60 is set, for example, to 250 $\mu$A so that the forward bias voltage Vf60 of the diode D6 smaller than the forward bias voltage Vf40 of the diode D4 which receives the constant current of 500 µA as above. Since the voltage VHH−Vf40 is set lower than the voltage VHH−Vf60 as in the foregoing, the comparator CP2 operates in a stable manner.

If the voltage exceeding the voltage difference Vf40−Vf60 between the input terminals is applied, that is, the diode D2 is turned on and a current flows from DUT to the buffer amplifier OP2, and the resultant voltage drop at the inverting input terminal exceeds the voltage of the noninverting input terminal VHH−Vf60, the comparator CP2 outputs an abnormal voltage detection signal Vs.

Thus, for example, when the output voltage Vo of the DUT exceeds the upper threshold voltage such as 8V, the comparator CP2 outputs the abnormal voltage detection signal Vs. Similarly, when the output voltage Vo of the DUT exceeds the lower threshold voltage such as −3V, the comparator CP1 outputs the abnormal voltage detection signal Vs. Based on the detection signal Vs, the switch SW1 is opened to isolate the DUT from the test system. When the actual output waveform is to be observed, the switches SW2 and SW3 are set to the side-a to prohibit the clamping operation from the excessive voltage of the DUT.

Figure 2:
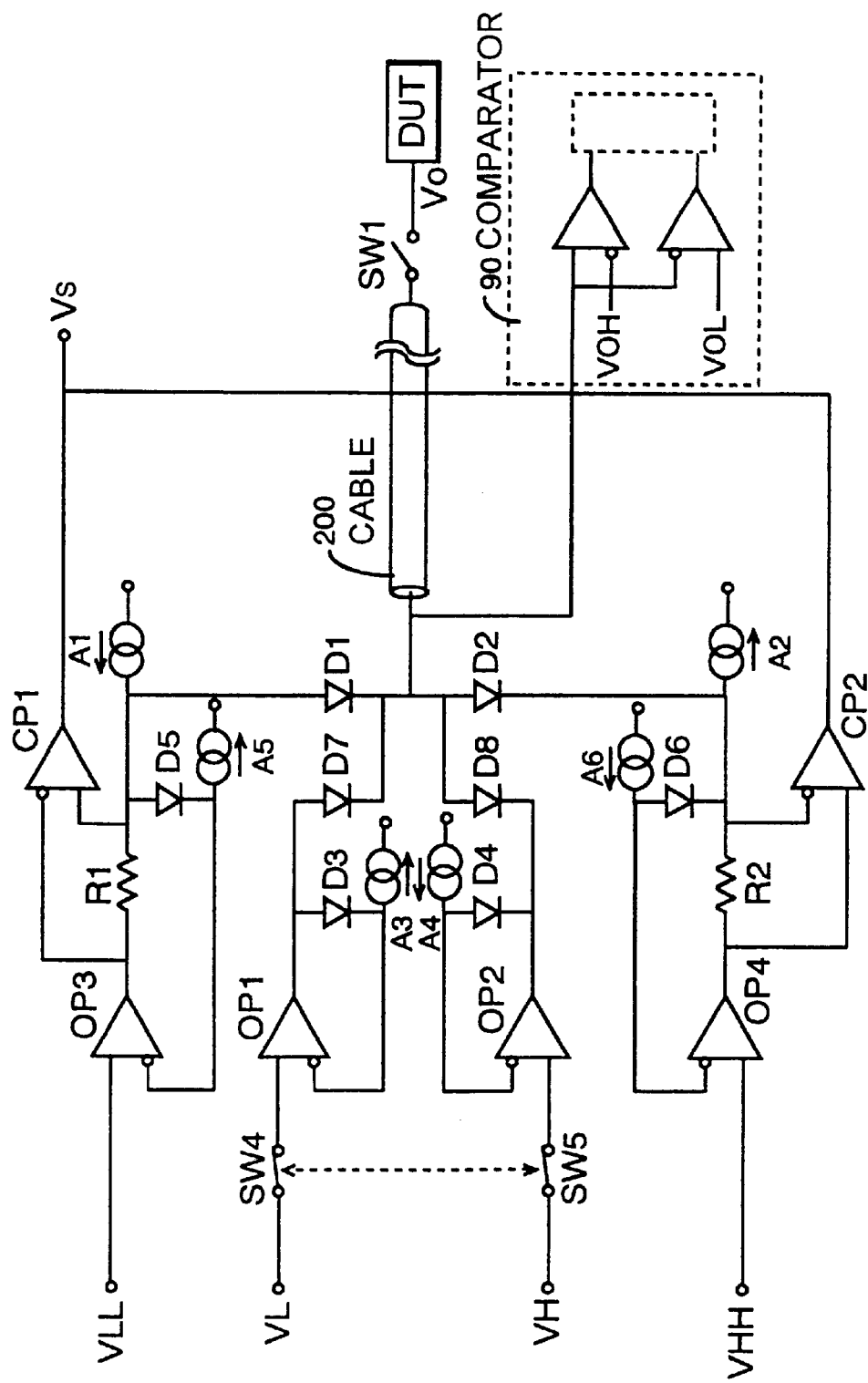
FIG. 2 is a circuit diagram showing an essential part of the voltage protection circuit in the conventional technology for a semiconductor test system which functions as an excessive voltage clamp circuit and an abnormal voltage detection circuit.

According to the present invention shown in FIG. 1, the number of circuit components and circuit size are substantially decreased by eliminating two buffer amplifiers and two diodes from the conventional example of FIG. 2.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A voltage protection circuit to be used in a semiconductor test system by functioning both as an excessive voltage clamp circuit and an abnormal voltage detection circuit, comprising:
   a switch for selecting a reference voltage out of a predetermined clamp voltage and a predetermined abnormal threshold voltage;
   a clamp diode connected to an output of a device under test (DUT) to open or close the output of the DUT;
   a buffer amplifier for providing the selected reference voltage to the clamp diode;
   a resister series connected between an output of the buffer amplifier and the clamp diode for detecting an abnormal voltage in the output of the DUT; and
   a comparator for comparing the reference voltage and an output voltage of the DUT through the clamp diode and generating a detection signal when the output of the DUT exceeds the reference voltage.

2. A voltage protection circuit as defined in claim 1, further comprising means for canceling a forward voltage of the clamp diode so that the output voltage of the DUT is clamped by the predetermined clamp voltage.

3. A voltage protection circuit as defined in claim 1, further comprising means for canceling a forward voltage of the clamp diode so that an abnormal voltage in the output of the DUT is detected when the output voltage of the DUT exceeds the predetermined abnormal threshold voltage.

4. A voltage protection circuit as defined in claim 1, further comprising means for isolating the output of the DUT from the semiconductor test system when receiving the detection signal from the comparator.

5. A voltage protection circuit as defined in claim 1, further comprising means for providing a voltage difference between two input terminals of the comparator so that the comparator is not affected by noise between the two input terminals.

6. A voltage protection circuit to be used in a semiconductor test system by functioning both as an excessive voltage clamp circuit and an abnormal voltage detection circuit, comprising:
   a first switch for selecting a first reference voltage out of a high predetermined clamp voltage and a high predetermined abnormal threshold voltage;
   a second switch for selecting a second reference voltage out of a low predetermined clamp voltage and a low predetermined abnormal threshold voltage;
   a first clamp diode connected to an output of a device under test (DUT) to open or close the output of the DUT;
   a second clamp diode connected to the output of the DUT to open or close the output of the DUT;
   a first buffer amplifier for providing the selected reference voltage to the first clamp diode;
   a second buffer amplifier for providing the selected reference voltage to the second clamp diode;
   a first resister series connected between an output of the first buffer amplifier and the first clamp diode for detecting an abnormal voltage in the output of the DUT;
   a second resister series connected between an output of the second buffer amplifier and the second clamp diode for detecting an abnormal voltage in the output of the DUT;
   a first comparator for comparing the first reference voltage and an output voltage of the DUT through the first clamp diode and generating a first detection signal when the output of the DUT exceeds the first reference voltage; and
   a second comparator for comparing the second reference voltage and an output voltage of the DUT through the second clamp diode and generating a second detection signal when the output of the DUT exceeds the second reference voltage.

7. A voltage protection circuit as defined in claim 6, further comprising means for canceling a forward voltage of each of the first and second clamp diodes so that the output voltage of the DUT is clamped by the predetermined high or low clamp voltage.

8. A voltage protection circuit as defined in claim 6, further comprising means for canceling a forward voltage of each of the first and second clamp diodes so that an abnormal voltage in the output of the DUT is detected when the output voltage of the DUT exceeds the predetermined high or low abnormal threshold voltage.

9. A voltage protection circuit as defined in claim 6, further comprising means for isolating the output of the DUT from the semiconductor test system when receiving the detection signal from the first or second comparator.

10. A voltage protection circuit as defined in claim 6, further comprising means for providing a voltage difference between two input terminals of each of the first and second comparators so that each of the comparators is not affected by noise between the two input terminals.

* * * * *